United States Patent
Suto

(10) Patent No.: US 9,638,742 B2
(45) Date of Patent: May 2, 2017

(54) METHOD AND APPARATUS FOR TESTING ELECTRICAL CONNECTIONS ON A PRINTED CIRCUIT BOARD

(75) Inventor: Anthony J. Suto, Sterling, MA (US)

(73) Assignee: Teradyne, Inc., North Reading, MA (US)

( * ) Notice: Subject to any disclaimer, the term of this patent is extended or adjusted under 35 U.S.C. 154(b) by 112 days.

(21) Appl. No.: 13/122,347

(22) PCT Filed: Nov. 13, 2009

(86) PCT No.: PCT/US2009/006110
§ 371 (c)(1),
(2), (4) Date: Apr. 1, 2011

(87) PCT Pub. No.: WO2010/056346
PCT Pub. Date: May 20, 2010

(65) Prior Publication Data
US 2011/0204910 A1 Aug. 25, 2011

Related U.S. Application Data

(60) Provisional application No. 61/140,736, filed on Dec. 24, 2008, provisional application No. 61/115,005, (Continued)

(51) Int. Cl.
*G01R 31/20* (2006.01)
*G01R 31/28* (2006.01)
(Continued)

(52) U.S. Cl.
CPC ....... *G01R 31/2815* (2013.01); *G01R 31/312* (2013.01); *G01R 31/304* (2013.01); *G01R 31/318577* (2013.01); *Y10T 29/49124* (2015.01)

(58) Field of Classification Search
CPC ................ G01R 31/304; G01R 31/312; G01R 31/31717; G01R 31/2812; G01R 31/2815;
(Continued)

(56) References Cited

U.S. PATENT DOCUMENTS 4,736,446 A * 4/1988 Reynolds et al. ............ 382/112
4,860,766 A * 8/1989 Sackner ........................ 600/561
(Continued)

FOREIGN PATENT DOCUMENTS

DE 102007011817 A1 9/2008
JP 60-219562 A 11/1985
(Continued)

OTHER PUBLICATIONS

International Search Report and Written Opinion for International Application No. PCT/US2009/006110 mailed Jun. 28, 2010.
(Continued)

*Primary Examiner* — Huy Q Phan
*Assistant Examiner* — Adam Clarke
(74) *Attorney, Agent, or Firm* — Wolf, Greenfield & Sacks, P.C.

(57) ABSTRACT

A test system and method for identifying open and shorted connections on a printed circuit board (PCB). An integrated circuit (IC) unit on the PCB is configured to generate a test signal on an output pin connected to a test pin on a second device, connector, or socket on the PCB. For a connection, the test signal is capacitively coupled to a detector plate proximal the second device. Based on the signal coupled to the detector, time domain analysis is performed on the coupled signal to determine if the test pin has a good connection to the PCB or if the pin is open or shorted. Analysis may include cross-correlating the coupled signal with a learned signal obtained from a known "good" PCB. The test pin may pass the test if the cross-correlation is
(Continued)

within a specified threshold window. If the test fails, additional tests may be performed to troubleshoot the cause of the testing failure.

24 Claims, 11 Drawing Sheets

Related U.S. Application Data filed on Nov. 14, 2008, provisional application No. 61/115,011, filed on Nov. 14, 2008.

(51) Int. Cl.
*G01R 31/312* (2006.01)
*G01R 31/304* (2006.01)
*G01R 31/3185* (2006.01)

(58) Field of Classification Search
CPC .......... G01R 31/026; G01R 31/2801–31/2818; G01R 31/318533–31/318597
USPC ....... 324/500, 538, 512, 519, 522, 523, 527, 324/531
See application file for complete search history.

(56) References Cited

U.S. PATENT DOCUMENTS

| | | | | |
|---|---|---|---|---|
| 5,786,697 A | * | 7/1998 | Khazam et al. | 324/537 |
| 5,844,412 A | * | 12/1998 | Norton | 324/548 |
| 5,978,314 A | * | 11/1999 | Pham | 367/52 |
| 6,104,198 A | * | 8/2000 | Brooks | 324/538 |
| 6,144,210 A | * | 11/2000 | Brooks | 324/519 |
| 6,473,029 B1 | * | 10/2002 | Powers | 342/189 |
| 6,813,737 B1 | * | 11/2004 | Srinivasaiah et al. | 714/726 |
| 6,941,235 B2 | | 9/2005 | Gattiker | |
| 6,958,619 B2 | * | 10/2005 | Yamaoka et al. | 324/754.28 |
| 6,989,683 B2 | * | 1/2006 | Li et al. | 324/750.14 |
| 6,998,849 B2 | * | 2/2006 | Tesdahl et al. | 324/519 |
| 7,061,250 B2 | | 6/2006 | Tesdahl et al. | |
| 7,702,982 B2 | * | 4/2010 | Chen et al. | 324/538 |
| 7,737,701 B2 | * | 6/2010 | Williamson et al. | 324/538 |
| 2004/0251144 A1 | * | 12/2004 | Chapples et al. | 205/775 |
| 2005/0090996 A1 | | 4/2005 | Gattiker | |
| 2006/0076959 A1 | | 4/2006 | Tesdahl et al. | |
| 2006/0103391 A1 | * | 5/2006 | Parker | 324/519 |
| 2006/0123289 A1 | | 6/2006 | Williams | |
| 2007/0001686 A1 | * | 1/2007 | Parker et al. | 324/529 |
| 2007/0013383 A1 | * | 1/2007 | Parker | G01R 31/312 324/519 |
| 2007/0013710 A1 | * | 1/2007 | Higgins et al. | 345/581 |
| 2009/0198461 A1 | * | 8/2009 | Hafed | G01R 31/31858 702/69 |

FOREIGN PATENT DOCUMENTS

| | | |
|---|---|---|
| JP | 60219562 A | 11/1985 |
| JP | 61-221661 A | 10/1986 |
| JP | 61221661 A | 10/1986 |

OTHER PUBLICATIONS

Chinese Office Action from Chinese Application 200980144869.0 dated Jan. 15, 2013.
Supplementary European Search Report and European Search Opinion for European Patent Application No. EP 09 82 6440 mailed Oct. 9, 2013.
Office Action for Chinese Patent Application No. 200980144869.0 dated Apr. 9, 2014.
Office Action for Chinese Patent Application No. 200980144869.0 dated Jul. 3, 2014.
Office Action for Chinese Patent Application No. 200980144869.0 dated Dec. 28, 2015.

* cited by examiner

METHOD AND APPARATUS FOR TESTING ELECTRICAL CONNECTIONS ON A PRINTED CIRCUIT BOARD

RELATED APPLICATIONS

This application is a U.S. National Stage Application under 37 U.S.C. §371 based on International Patent Application Number PCT/US2009/006110, filed Nov. 13, 2009, which claims the benefit of and priority to U.S. Provisional Patent Application Ser. No. 61/140,736, filed Dec. 24, 2008, U.S. Provisional Patent Application Ser. No. 61/115,005, filed Nov. 14, 2008, and U.S. Provisional Patent Application Ser. No. 61/115,011, filed Nov. 14, 2008. All of the foregoing are hereby incorporated by reference in their entireties.

BACKGROUND

1. Field of the Invention

The invention relates generally to printed circuit board testing, and more particularly to identifying open and shorted connections to components on a printed circuit board.

2. Description of Related Art

Detecting open solder connections to components such as integrated circuit devices, connectors, and sockets on printed circuit board (PCB) assemblies continues to be a major challenge on today's manufacturing floor. Many PCBs are designed for testing by connecting test pads to signal transmission paths on the board. These test pads provide electrical contact points for test equipment.

However, connecting a test pad to signal path may undesirably change the electrical characteristics of the signal path, particularly, if the signal path caries high speed signals. FIG. 1A illustrates an example of a transmission path to which a test pad 110 has been connected for use as a testing contact point. In this example the transmission path forms a microstrip line 100 connecting a device 101 to a device 103.

FIG. 1B illustrates a simple transmission line model representing the electrical characteristics of the microstrip 100 with a test pad 110. The test pad 110 increases the capacitance of the microstrip in this region, resulting in a substantial decrease in the impedance of the signal path near the test pad 110. That is, the impedance, $Z_1$, at the test pad 110 may be substantially less than the impedance, $Z_2$, elsewhere along the microstrip line (i.e., $Z_1 < Z_2$).

For high speed signals, such changes in impedance can cause reflections or other undesirable effects that interfere with reliable signal transmission. Thus, test pads may limit the signaling speed that may be reliably achieved on a transmission path.

Some contemporary techniques that do not require test pads rely on onboard boundary scan devices to generate square wave test signals on the transmission paths. Other integrated circuit devices, connectors and sockets connected to the transmission path will receive the signal which is then capacitively coupled to a nearby detector plate.

Commercial applications of this opens test technologies rely upon applying a periodic signal in a narrow range of frequencies for performing opens measurements. The test frequency is typically near 10 KHz because lower frequencies generally result in lower detected signal amplitude, which will lower fault coverage. Frequencies in excess of 10 KHz tend to couple into the detector plate from the PCB rather that the component being tested, resulting in false passes.

This narrow range of useable frequencies becomes problematic when the stimulus is being synthesized through a boundary scan chain. This is because the square wave output frequency on a boundary scan output pin is a function of the test access port (TAP) test clock (TCK) frequency as well as the number of scan cells that are in the scan chain. As a result, with the vast variety of board types with varying boundary scan integrated circuit (IC) content and different number of scan cells, it is difficult for suppliers to provide a stimulus frequency that is within the range of their hardware operating envelope.

Some automatic test equipment (ATE) suppliers have promoted new boundary scan commands inside the IC silicon design to make testing simpler. One such command is called Extest_Toggle. When this command is used, a selected output pin will toggle at exactly one half the TCK input clock frequency, thus eliminating the interdependence between the output pin's clock frequency and the scan chain length. However, this new boundary scan command has not been widely implemented in semiconductor devices typically mounted to PCBs.

SUMMARY

The inventor has recognized and appreciated that with the growing use of higher speed signals, printed circuit board (PCB) designers can no longer tolerate the negative transmission line effects of test pads that are used to gain electrical access during incircuit testing. An improved vectorless test method has been developed to address the loss of test coverage on high speed signals that reside on contemporary printed circuit board assemblies. Methods, systems, and apparatus for quickly and effectively identifying open and shorted connections to components on a PCB are provided.

In some embodiments, an integrated circuit (IC) device on a circuit assembly, such as a PCB, is configured as a virtual signal generator. The virtual signal generator generates a test signal on a signal path connected to a pin of another component on the circuit assembly. A detector plate located proximal to the second IC device acts as a pick up, coupling a portion of the test signal. The transient characteristics of the coupled signal are analyzed to determine if there is a good connection, or if the test pin is opened or shorted.

Any suitable form of time domain analysis may be performed. For example, in some embodiments, the coupled signal received by the detector plate is cross-correlated with a reference signal. The reference signal may be obtained during a learn phase performed on a known "good" unit. The cross-correlation is compared to a threshold value, which also may be established during the learn phase, to determine the quality of the connection to the pin under test. If the test fails, additional tests may be performed to determine whether a faulty connection is a short or an open.

In some aspects, the invention relates to a method of testing a circuit assembly. The method comprises configuring a first component on the circuit assembly to generate a first signal on a first pin of the first component; placing a probe adjacent a second component on the circuit assembly; performing time domain analysis of a second signal, the second signal being capacitively coupled from the second signal to the probe; and indicating a test result based on the time domain analysis of the second signal.

In another aspect, the invention relates to a method of testing a circuit assembly. The method comprises configuring a first component on the circuit assembly comprising a plurality of first pins to generate a plurality of first signals, each first signal generated on a corresponding first pin from the plurality of first pins; placing a probe adjacent a second component on the circuit assembly, the second component comprising a plurality of second pins; analyzing a second signal capacitively coupled from the second component to the probe, the analyzing comprising, for each of a plurality of time windows in the second signal, cross-correlating the second signal in the window with a reference vector representative of an expected value of a signal of the plurality of first signals coupled to the probe through a different pin of the second component; and indicating a test result based on the analyzing.

In yet another aspect, the invention relates to a computer storage medium comprising computer executable instructions that, when executed on a test system having a computer, control the test system to test a circuit assembly according to a method. The method comprises configuring a first component on the circuit assembly to generate a first signal on a first pin of the first component; placing a probe adjacent a second component on the circuit assembly; performing time domain analysis of a second signal, the second signal being capacitively coupled from the second signal to the probe; and indicating a test result based on the time domain analysis of the second signal.

BRIEF DESCRIPTION OF DRAWINGS

The invention and embodiments thereof will be better understood when the following detailed description is read in conjunction with the accompanying drawing figures. In the figures, elements are not necessarily drawn to scale. In general, like elements appearing in multiple figures are identified by a like reference designation. In the drawings.

DETAILED DESCRIPTION

The inventor has recognized and appreciated the need for vectorless testing techniques that overcome limitations of the prior art. Systems and methods for testing the electrical connection of pins on a component, such as an integrated circuit (IC) device, connector, or socket, to a circuit assembly are disclosed. The system utilizes a component configured as a virtual signal generator to generate test signals. In some embodiments, the virtual signal generator is a boundary scan device that utilizes a boundary scan chain for testing a series of pins. A test signal propagates from the virtual signal generator along a transmission path to a component to be tested, such as another IC device, a connector, or a socket. A detector plate near the component under test is used to receive the test signal as a result of capacitive coupling to conductors in the component under test. The characteristics of the coupled response signal are indicative of the quality of the electrical connection of a pin on the component that should be connected to the signal path or of the presence of an electrical short between pins.

The characteristics of the response signal are determined by analysis in the time domain that includes comparing the response signal to known responses. The analysis leads to a determination of whether there is a fault associated with the pin. If the analysis indicates the connection is faulty, additional tests may be performed to identify the nature of the fault, such as an open or short. The time domain analysis determines a likelihood that a detected response matches a learned response signal. As a result, the time domain analysis is resistant to random noise, reducing false reports of errors on a manufacturing floor where tests are being conducted.

Moreover, the time domain analysis can operate on a relatively simple signal, which is readily generated, in contrast to prior art approaches in which an oscillating test signal was generated by a boundary scan part. Also, because the test signal can be as simple as a single signal transition, parameters of the test signal are not constrained by the length of a scan chain in the device acting as a virtual signal generator.

Figure 1A:
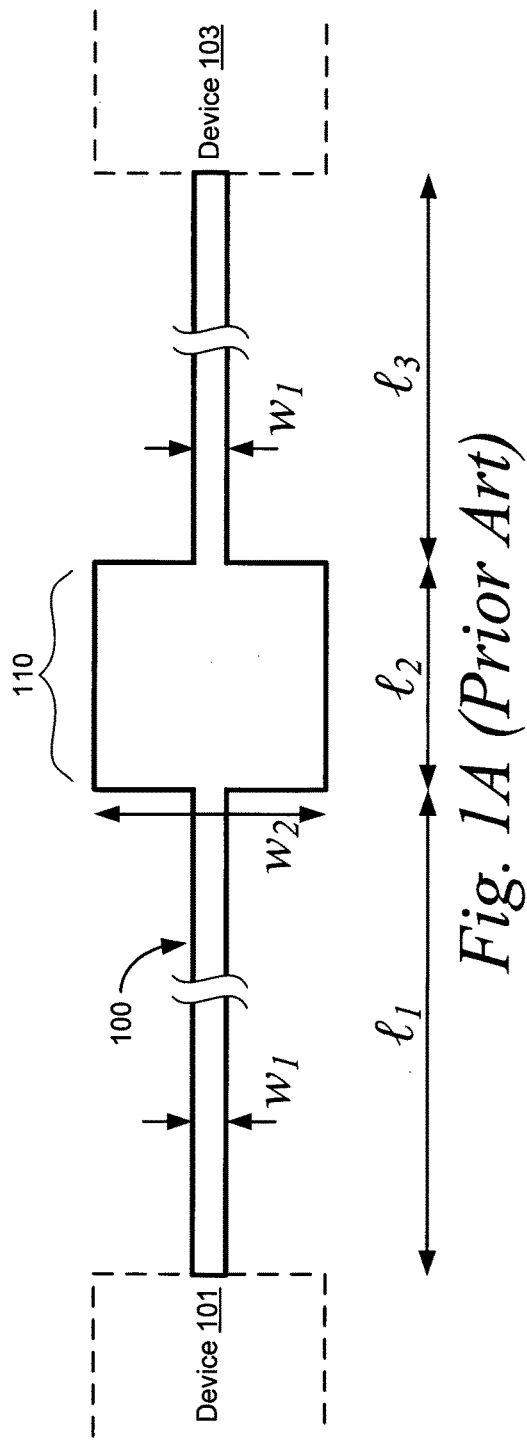
FIG. 1A is an illustration of a microstrip transmission line having a test access pad.
Figure 1B:
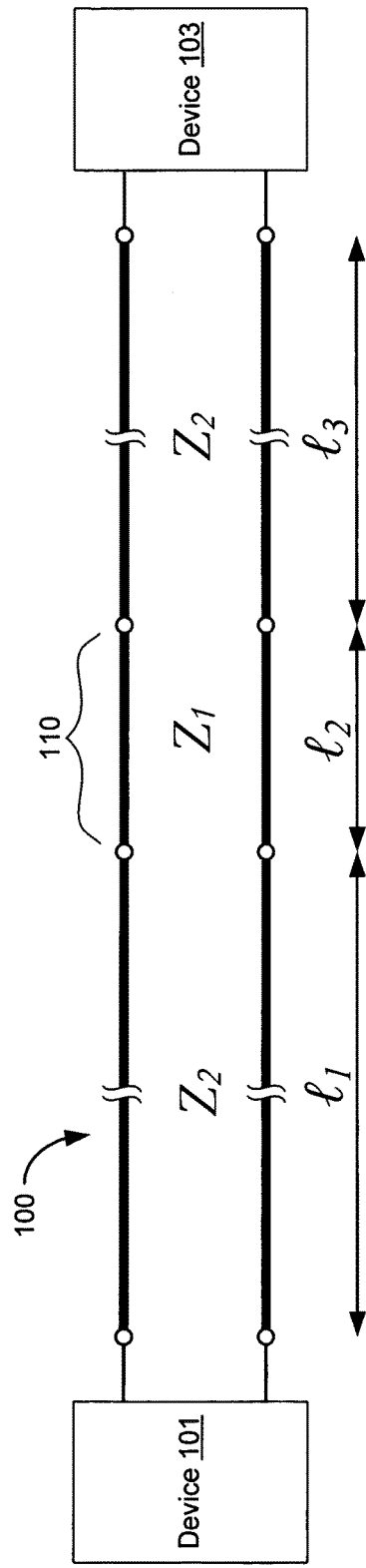
FIG. 1B is an electrical model of the transmission line illustrated in FIG. 1A.
Figure 2:
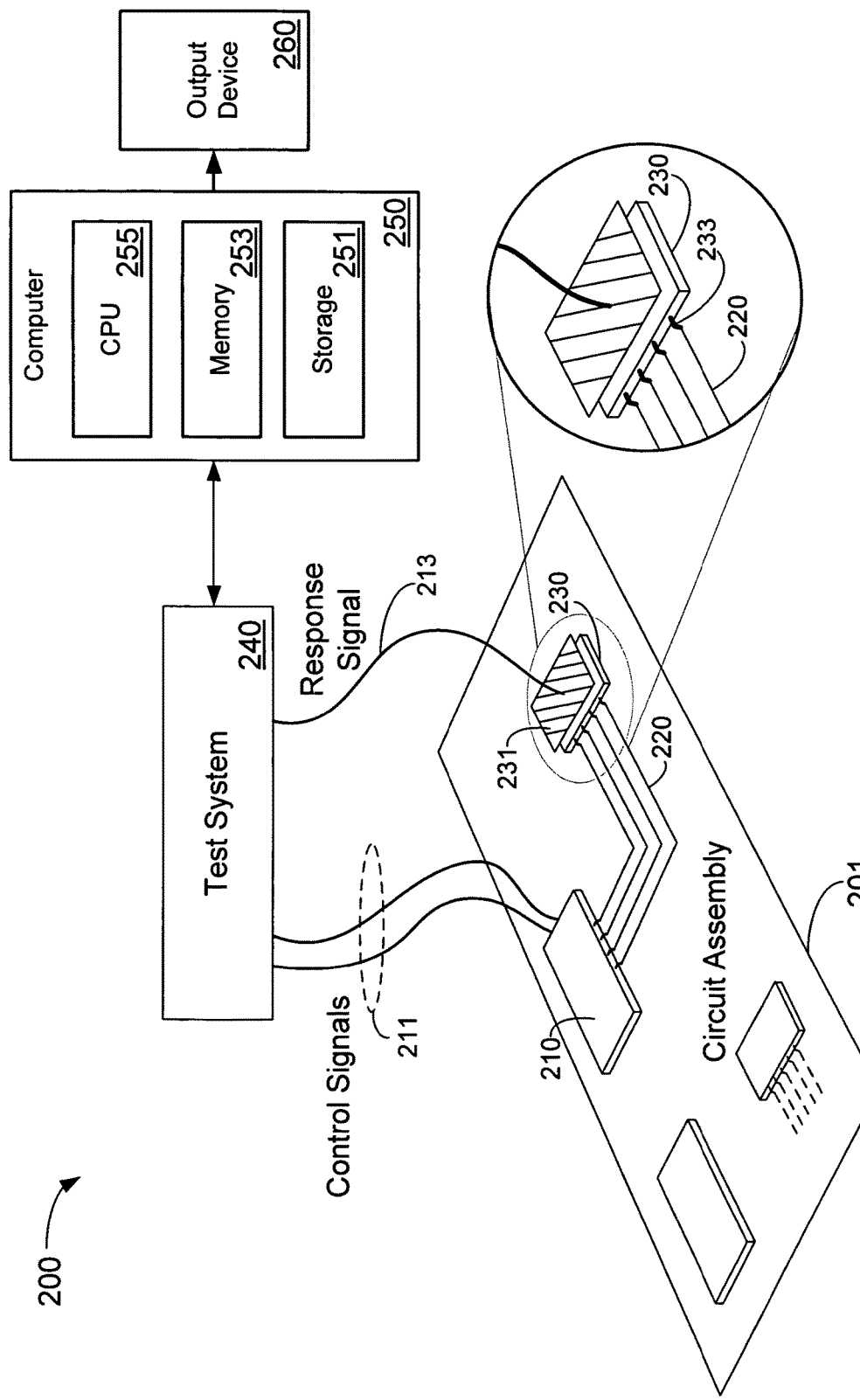
FIG. 2 is a test setup according to some embodiments of the invention.

FIG. 2 illustrates a test setup 200 for shorts or opens testing an electronic assembly. Such a setup may be used as part of the manufacturing process for circuit assemblies.

As shown in FIG. 2 test set up 200 is configured to test a circuit assembly 201. In the embodiment illustrated, a test signal is introduced into circuit assembly 201 by controlling a device on circuit assembly 201 a "virtual" signal generator. The virtual signal generator may be controlled by automatic test equipment to generate the test signal on signal paths that, if circuit assembly 201 is assembled correctly, are connected to pins on one or more other components of circuit assembly 201. By sensing and analyzing the test signal reaching that component or components, an assessment may be made of the quality of the connections of that component or components to the circuit assembly. The operation of the virtual signal generator may be varied to generate test signals on different conductive paths in the circuit assembly or different devices may be controlled to act as a virtual signal generator at different times. Further, the components at which the test signal is sensed may also vary so that connections across the circuit assembly may be tested.

In FIG. 2, a semiconductor chip is configured to act as the virtual signal generator 210. The response is sensed at a second device 230 mounted on a circuit assembly 201, such as a printed circuit board (PCB). A signal path 220 connects the virtual signal generator 210 and the second device 230. As illustrated, the test setup is configured to test an electrical connection between the signal path 220 and a test pin 233 on the second device 230. Because the same test process may be used for each pin on a component and each component on a circuit assembly, testing is described in connection with a single pin on a component for simplicity. However, it should be understood that pins associated with other components could be tested in a similar fashion, at different times, or where signals associated with testing of one component or pin will not interfere with testing of others, such testing may be performed the same time.

The test system 240 provides control signals via control connection 211 to the virtual signal generator 210. If virtual signal generator 210 is a boundary scan device (BSD), control connection 211 may connect to a test access port (TAP). The control signals configure a component to act as the virtual signal generator 210 so that it will output test signals on the signal path 220. Any suitable signals may be coupled through the test access port. For example, those signals may specify test signal, control the device to generate the test signal at a specific pin or provide a test clock or other timing signals. Such signals may be specified in a format as known in the art for boundary scan devices or in any other suitable format.

The test system 240 also measures a response signal via response connection 213. The response connection 213 measures the response signal coupled to a detector plate 231 near the second device 230. Hence, detector plate 231 is configured to receive a signal capacity coupled from device 230.

The test system 240 may perform signal processing of the response signal before providing the response signal to a computer 250. The computer 250 is configured to perform further analysis of the response signal to make a determination about the electrical connection between the signal path 220 and a test pin 233. As shown, computer 250 has a processing unit 255, memory 253 and storage media 251, but this configuration is an example only. Though illustrated as separate units, test system 240 and computer 250 may be embodied as a single device or implemented in any other suitable way.

Computer 250 may be programmed to control the overall test process. For example, computer 250 may reconfigure the test setup 200 to test other pins on circuit assembly 201. If computer 250 determines a test fails, additional tests may be performed to identify the cause of the failure. The computer 250 may output information about the tests to an output device 260, such as a display or printer, or may send information about defects on circuit assembly 201 to other manufacturing equipment for use in subsequent stages of manufacture.

Though FIG. 2 illustrates a test setup in which a single pin is tested, test setup 200 may be configured to perform tests for any number of test pins 233 on the circuit assembly 201. Multiple devices on circuit assembly 201 may be configured as virtual signal generators and multiple detector plates may be included so that pins on multiple devices may be tested. The components on the circuit assembly 201 may be configured and controlled to generate and measure appropriate test and response signals. For example, during the testing of circuit assembly 201 a single device may act as a virtual signal generator to provide test signals to multiple devices. Similarly, a device may receive test signals from multiple virtual signal generators. Further, the roles of devices may be different at different at times, such that some devices act as signal generators at some times, but at other times, response signals are measured at those devices.

Figure 3:
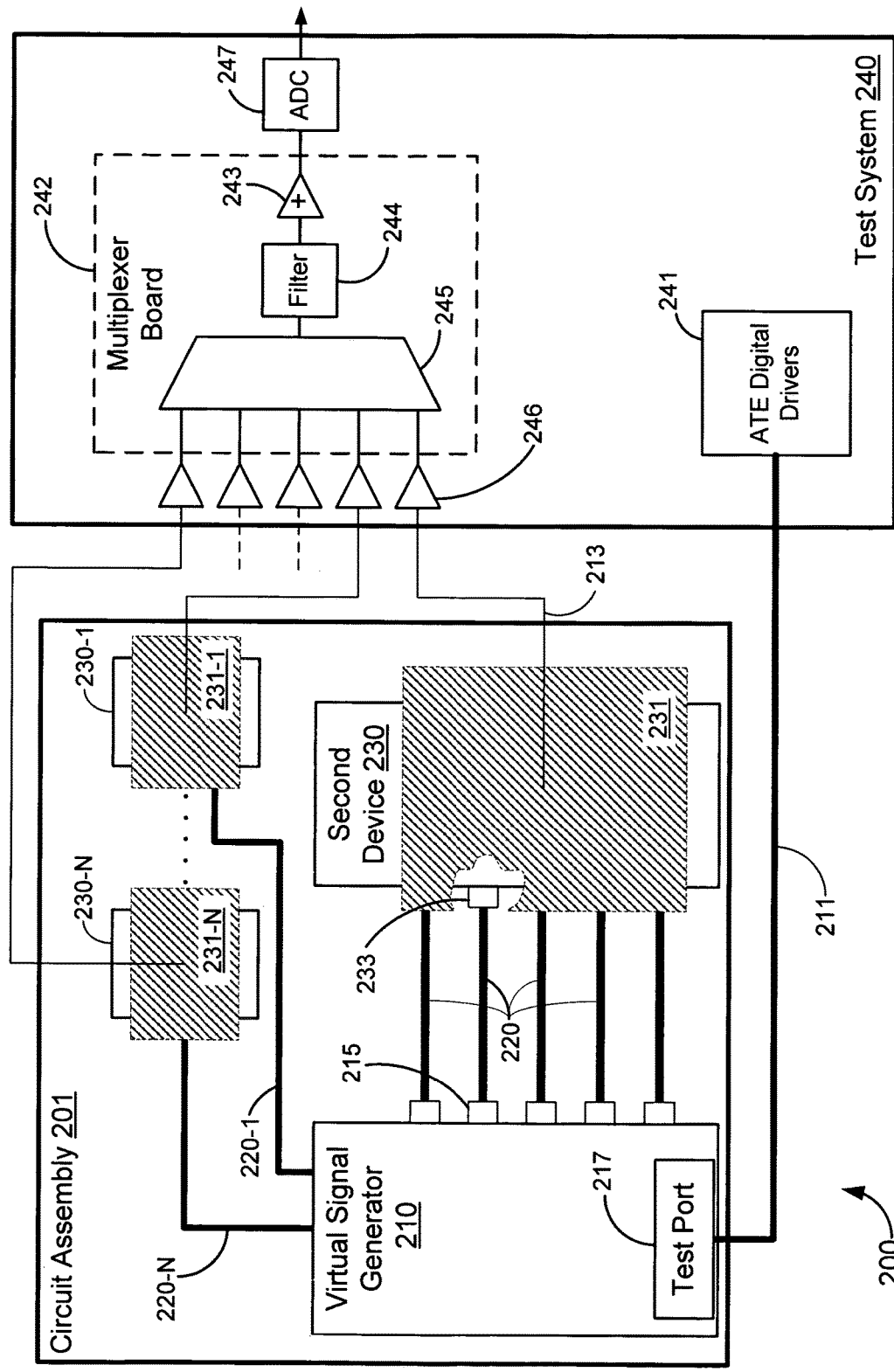
FIG. 3 is a test setup according to some embodiments of the invention.

FIG. 3 is a more detailed view of components of the circuit assembly 201 and test system 240 according to some embodiments. In the illustrated example, multiple signal paths 220 connect the virtual signal generator 210 to the second device 230. Additional signal paths 220-1 and 220-N may connect the virtual signal generator to other devices 230-1 and 230-N.

In some embodiments, signal paths 220 are part of a high speed bus operating at 3 gigabits per second (Gbps) or greater. For example, signal paths 220 may be part of a PCI Express bus, Quick Interconnect (QPI), or Serial ATA (SATA) bus. In such an embodiment, it is desirable to test pins connected to those signal paths without the use of test pads that can disrupt signals on those paths.

As shown, a component on circuit assembly 201 is controlled to operate as virtual signal generator 210. Virtual signal generator 210 is controlled by test system 240 to generate one or more test signals on traces to which other devices should be connected on a good board. Here, that control is provided through a connection to virtual signal generator 210 that, in normal operation of circuit assembly 201, carries high speed signals. In the example illustrated, virtual signal generator 210 is controlled through a control connection 211. Control connection 211 may contain multiple lines to support input and output of data and control signals and timing signals. Though, the specific format of control connection 211 is not a limitation on the invention.

In the embodiment illustrated, the control connection 211 is connected to test port 217 of the virtual signal generator 210. In some embodiments, test port 217 may be a test access port of a boundary scan device. As is known in the art, such a test access port may be used to provide control signals to a boundary scan device to cause the device to input test data to boundary scan registers incorporated in the device for boundary scan testing. When desired test values are in the boundary scan registers, those values may be transferred from the boundary scan registers into operational circuitry within the device. In this way, the state of the device can be controlled through test port 217 to establish desired test conditions. Conversely, values from the operational circuitry within the device can be transferred to the boundary scan registers. In a conventional boundary scan test, these values, representing results of operation of the device under the test conditions, are then output through test port 217. Though, for connections testing, the boundary scan functions can be used to cause virtual signal generator 210 to output on an output pin of virtual signal generator 210.

As shown, test port 217 is coupled to test system 240. The test system 240 may include one or more automated test equipment (ATE) digital drivers 241 to provide control, data and timing signals to the virtual signal generator via control connection 211. Rather than configure virtual signal generator 210 for testing internal circuitry of virtual signal generator 210, the control and data signals provided through test port 217 configure virtual signal generator 210 to output signals on leads connected to signal paths to which other devices being tested are connected. In the scenario illustrated, virtual signal generator 210 is configured through signals generated by tester 240 on connection 211 to generate a test signal on output pin 215.

As shown, output pin 215 is connected to a signal path 220 to which a pin under test 233 of second device 230 should be connected in a properly manufactured circuit assembly. The signals generated by tester 240 may change so that the test signal on output pin 215 is a time varying signal that can capacitvely couple through second device 230 to a detector plate 231. Accordingly, the state of a connection of pin under test 233 to a signal path 220 may be tested by analyzing a signal capacitvely coupled to plate 231.

In some embodiments multiple detector plates 231 are positioned over the circuit assembly 201, and hardware to condition the response signals is shared by multiplexing the connections. The test system 240 may include a multiplexer board 242 configured with a multiplexer 245. The response signals from each detector plate 231, 231-1, and 231-N may be buffered by a corresponding buffer 246 before connection to the multiplexer 245. Buffer 246 may be any suitable buffer. In some embodiments the detector plates 231 may contain an active buffer 246 which buffers the response signal for the multiplexer 245.

Although each detector plate 231, 231-1 . . . 231-N is illustrated with a single corresponding second device 230, detector plates 231 may be configured in any suitable way. For example, multiple detector plates 231 may be deployed over a single device 230, a single detector plate 231 may be deployed over multiple devices 230, or some combination of both.

The multiplexer 245 is controlled in any suitable way to select a response signal for conditioning and analysis. In some embodiments the response signal is conditioned by a filter 244 and amplifier 243. The response signal is digitized by an analog-to-digital converter (ADC) 247 and then analyzed by computer 250 (FIG. 2).

In some other embodiments, each detector plate is configured with dedicated conditioning and digitization hardware. In yet some other embodiments, test system 240 includes multiple multiplexer boards 242 to allow for increased parallelization.

Regardless of the number of devices configured as virtual signal generators or the number of detector plates, the test setup may be controlled to generate test signals and measure response signals. The test signals may be shaped and the response signals may be analyzed in a fashion that allows reliable detection of open or shorted pins.

Example test and response signals, which may be used in some embodiments, are described with reference to plot 400 shown in FIG. 4. Plot 400 shows two test signals 401 and 402, each output from the virtual signal generator 210 onto a signal path 220 and each corresponding to one of the pins 233 on the second device 210. A response signal 405 measured at detector plate 231 is also shown. Each signal is plotted as a function of time (time axis 420) and amplitude (amplitude axis 410). The signals are offset on the amplitude axis 410 for clarity. A reference level is indicated by markers 411, 413, and 415, for signals 401, 403, and 405, respectively.

In this example, the test signals are shown as pulses, each with a leading edge and a trailing edge. In this example, test signal 401 is applied to an open pin, "pin 1," and test signal 403 is applied to a good pin, "pin 2." The signals are coupled to a common detector plate from which response signal 405 is measured. As can be seen in FIG. 4, though test signals 401 and 403 have generally the same shape, the response signal is different following application of a test signal to an open pin then to a good pin.

Figure 4:
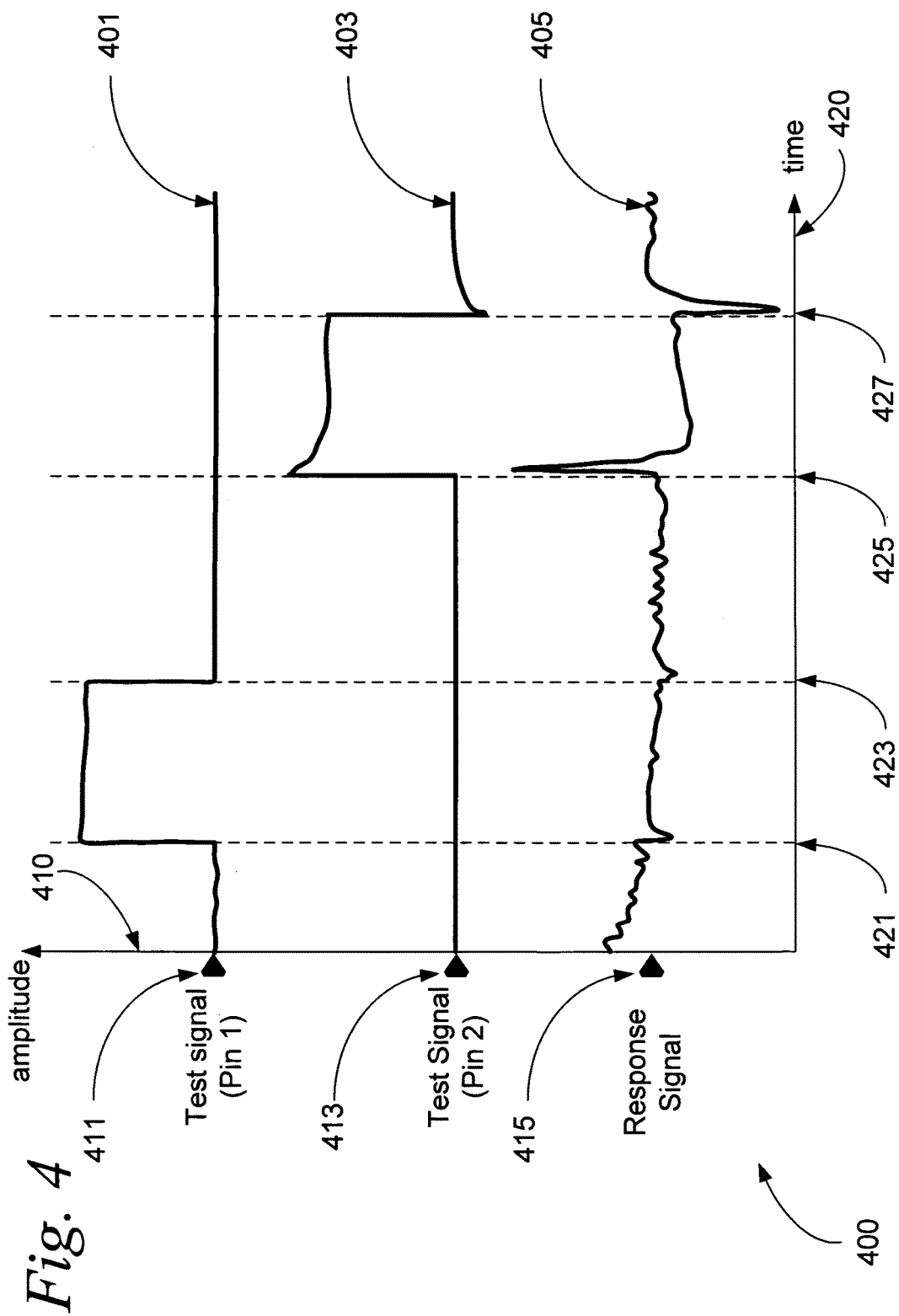
FIG. 4 is a plot of an experimental test result illustrating some features of some embodiments.

Further, as can seen from FIG. 4, the response to a test signal shaped as a digital signal applied to a good pin contains relatively large swings. These large swings occur at times associated with the edges of the test signal for a good pin, but not an open. As shown, near the transition times 421 and 423, very little of test signal 401 is coupled to the detector plate because pin 1 is open. Near times 425 and 427 the response signal 405 has large peaks, corresponding in time to the edges of the test signal 403.

The inventor has recognized and appreciated that, though digital test signals, such as test signals 401 and 403, are not generally used for capacitive testing, the response to such test signals in a capacitive testing system may be analyzed in the time domain to provide a highly reliable and automatic determination of the quality of connection of each pin under test.

In some embodiments, the response signal is analyzed to detect a characteristic response signal representative of capacitive coupling of an edge of a test signal when such an edge occurs. In the embodiment illustrated, the characteristic response is a peak followed by an exponential decay. Though, in other embodiments, the response to signal applied to a good pin may be in other forms. For example, in instances in which the test signal contains a pattern of edges during some time window, the characteristic response may be a pattern of peaks, such as the two peaks shown in FIG. 4 associated with transitions 425 and 427. Though, in other embodiments in which a test signal with multiple edges is used, the characteristic response may be regarded as the response to one edge signal. In such embodiments, the status of a pin under test may be assessed based on the degree to which the characteristic response is received at a time associated with each of the edges.

The specific characteristic response used in testing a pin on a circuit assembly may be determined during a learn phase. During the learn phase, signal characteristics associated with a known good pin may be learned. The learned signal for any pin on a circuit assembly may be obtained from the response signal measured when a test signal is applied to a corresponding pin on a known working circuit assembly. Though, in some embodiments, the learned signal may be obtained computationally, for example, by simulation using appropriate electrostatic modeling tools.

During the learn phase, a learned signal may be obtained for each pin on a board to be tested during a subsequent production test phase. The learn phase is performed with a good circuit assembly, such that each learned signal represents the response signal when the corresponding pin has a good electrical connection to its signal path. Test setup 200 may be used in any of these phases. In some instances, the same equipment may be used in establishing the test setup for both the learn phase and the production test phase. However, the same test setup is not required and in other embodiments, the different phases may be performed at different times and in different places with different equipment.

During the test phase, a circuit assembly of unknown quality is tested to identify good and faulty pins. For each tested pin, the response signal is analyzed using the learned signal obtained during the learn phase. A comparison between the response signal and the learned signal may be used to generate a value indicative of the degree to which the response signal includes the learned response following application of the test signal. The value can then be compared to one or more thresholds to determine whether the test pin is properly connected. If the response signal does not adequately contain the learned response, the pin can be determined to be faulty. The pin may be faulty either because it is open or shorted to structures other than the signal path intended to carry a signal to that pin. In either event, the response will deviate from the learned signal. Once a faulty pin is detected, subsequent testing may be performed to determine the nature of that fault, such as whether it is an open or a short.

Figure 5:
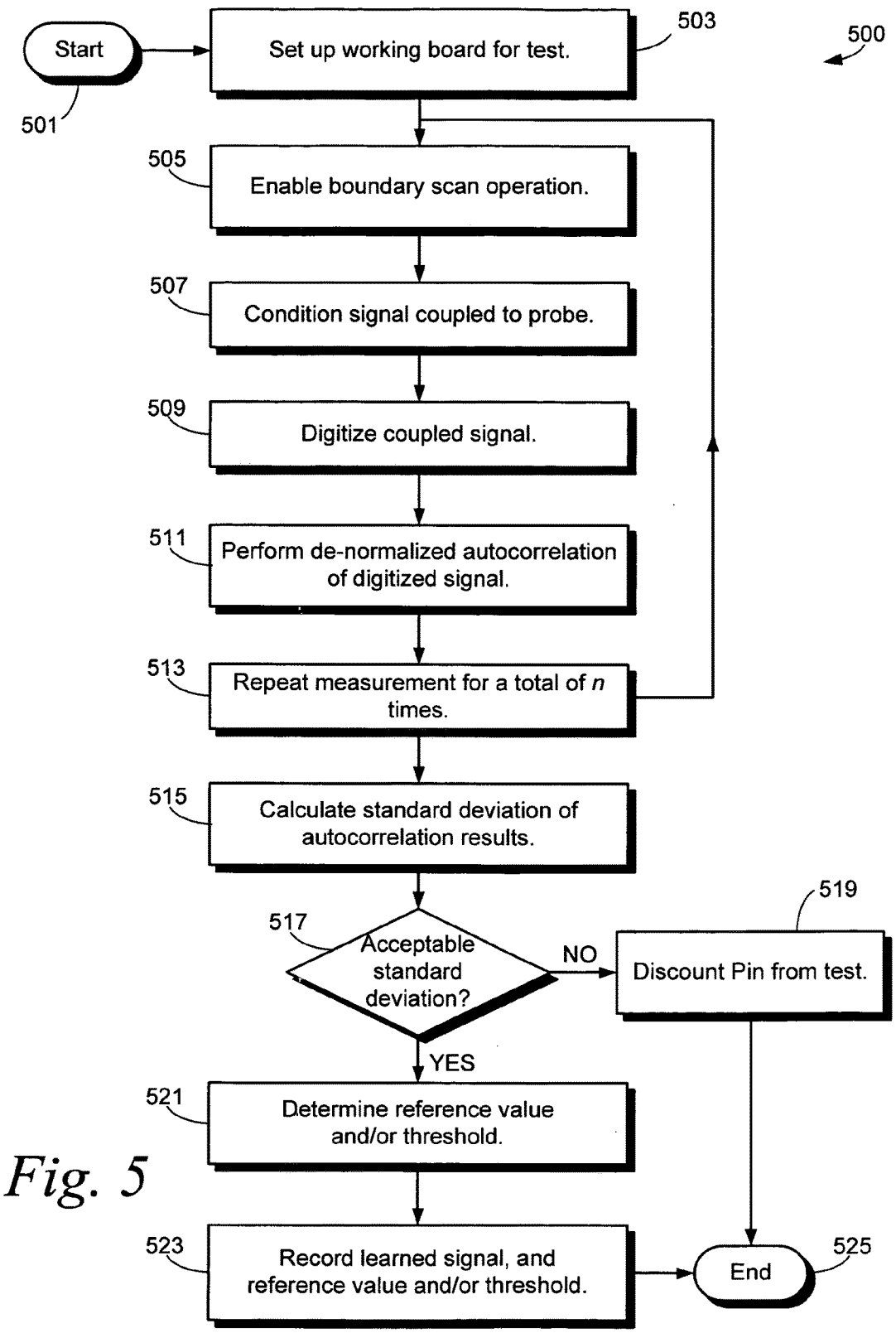
FIG. 5 is a flow diagram illustrating a method for obtaining a learned signal and reference value according to some embodiments.
Figure 6:
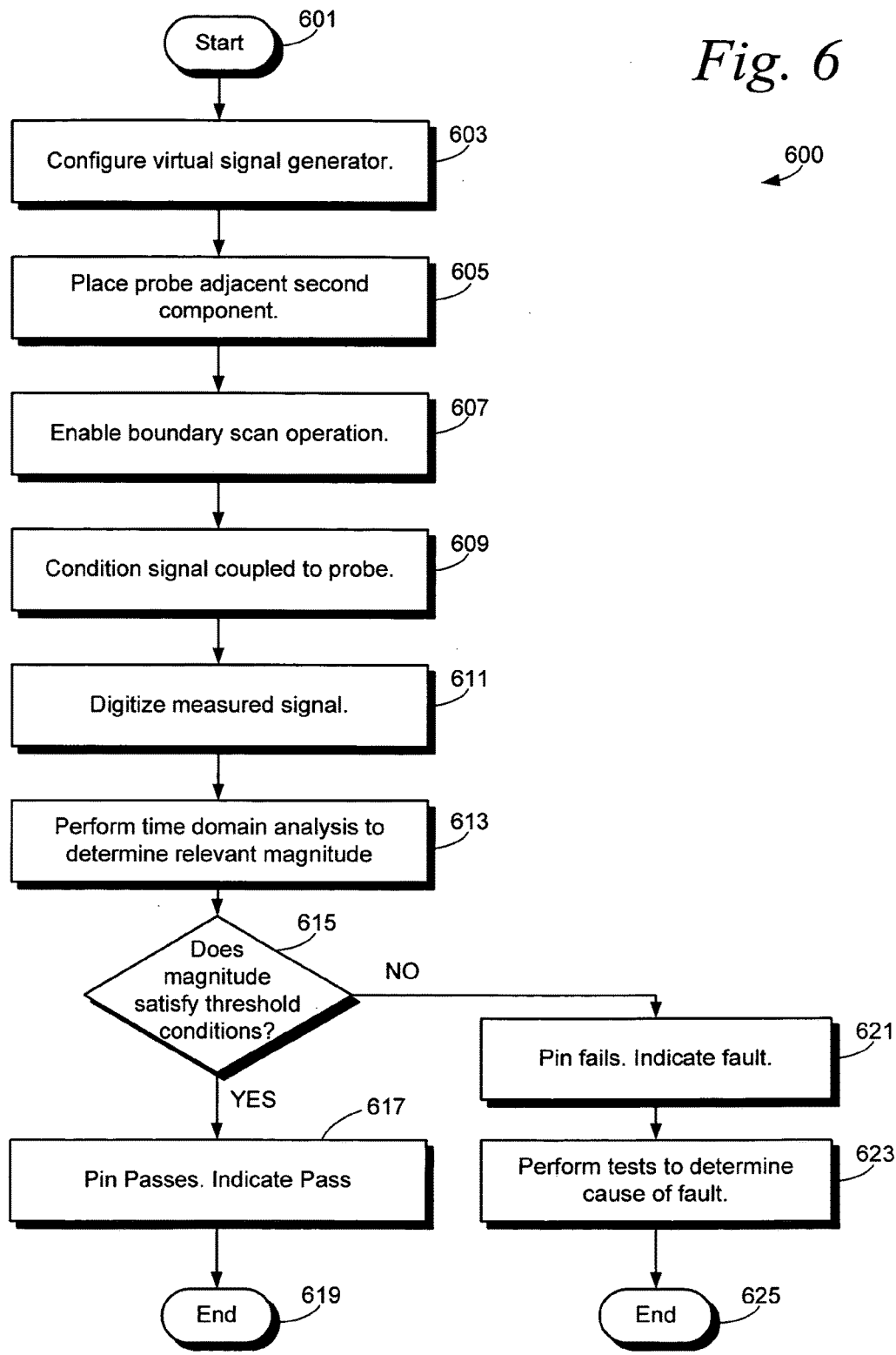
FIG. 6 is a flow diagram illustrating a method for testing a pin in a unit under test according to some embodiments.
Figure 9:
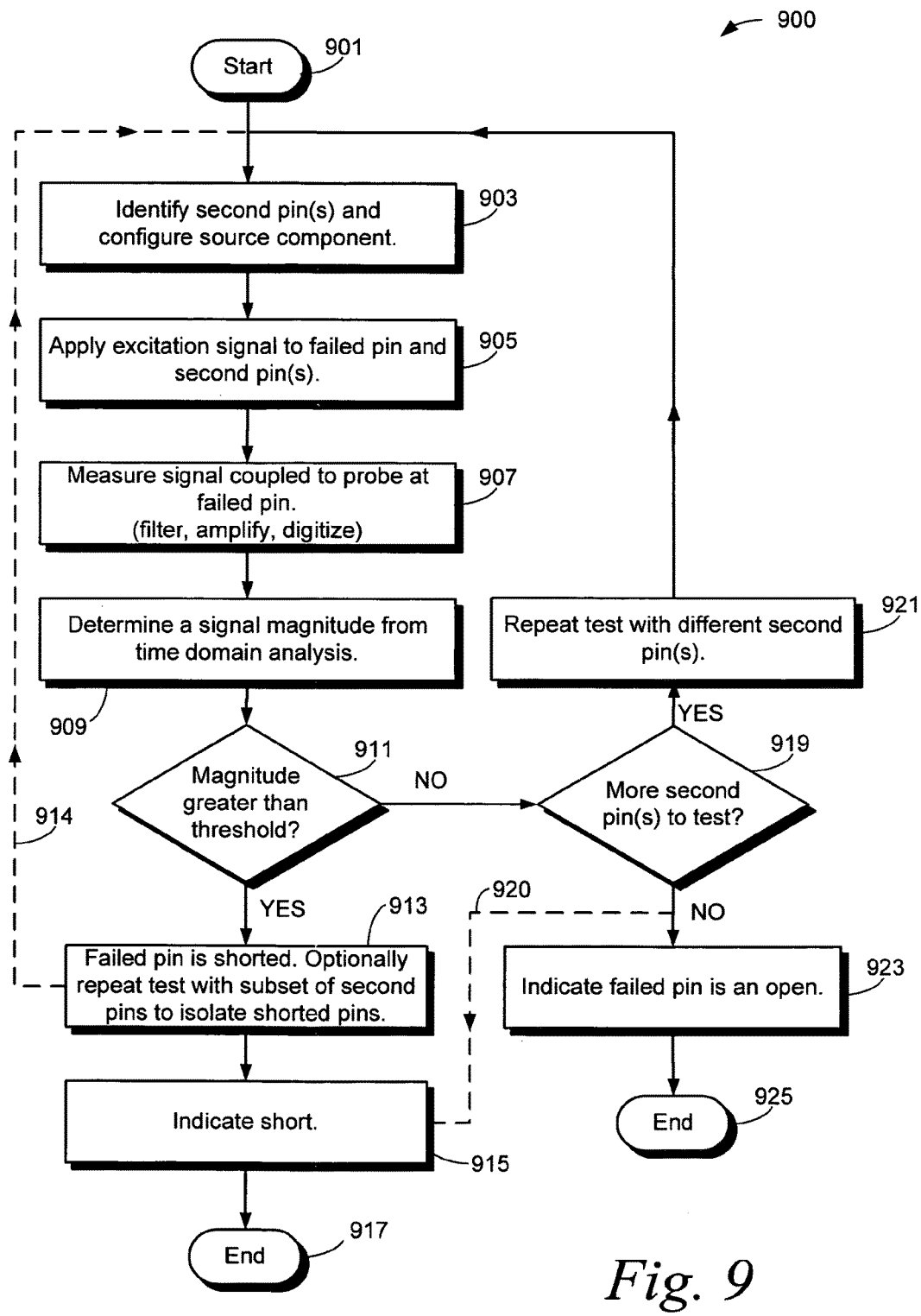
FIG. 9 is a flow diagram illustrating a method for determining whether a faulty connection is a short or an open according to some embodiments.

FIG. 5 is a flow chart of a process that may be performed during a learn phase, FIG. 6 illustrates processing that may be performed during a test phase and FIG. 9 illustrates a process for determining a fault type. Test setup 200 may be configured to perform method 500 during the learn phase, method 600 during the test phase, and method 900 for determining the cause of a faulty pins failure.

Method 500, shown as a flow chart in FIG. 5, is a method for obtaining the learned signal and a reference value. The reference value is used to determine the thresholds for the test phase to distinguish between good and faulty pins. Method 500 may be performed for each pin to be tested such that each pin has its own learned signal and threshold. Though, in some instances, multiple pins in a circuit assembly may have similar structures and a learned signal and/or thresholds determined for one pin may be used for multiple pins. In some embodiments, computer-executable instructions are recorded on storage media 251 of computer 250 and executed by processing unit 255 to control test system 240 to perform method 500. Though, the steps illustrated in FIG. 5 may be performed by any suitable equipment.

Method 500 begins at step 501 for a pin on the circuit assembly. At step 503 a known good circuit assembly 201 is placed in the test setup 200 (FIGS. 2 and 3). Step 503 may include, for example, mounting the circuit assembly 201 in a fixture connected to the test system as known in the art, properly aligning the detector plates 231, connecting control connections 211 to appropriate test ports 217, connecting response connections 213 to the detector plates 231, and the like.

At step 505, boundary scan operation is enabled for a device on the board to operate as a virtual signal generator for the pin. That device is controlled, using boundary scan commands as are known in the art, to generate test signals on the appropriate output pins 215 of a BSD virtual signal generator 210. In embodiments in which virtual signal generator 210 is not a boundary scan device, step 505 is performed by initiating a program, executing commands, or otherwise causing the virtual signal generator 210 to output appropriate voltages and test signals to its output pins 215.

Any suitable test signals may be output to the output pin 215. In some embodiments, the test signal includes a rapid change in signal voltage. For example, a virtual signal generator that produces a digital output using two different voltage levels may transition the output pin one or more times between a voltage representing the first state and a voltage representing the second state. The circuit assembly and test system may be controlled such that signals on signal paths other than those connected to output pin 215 are held at a constant voltage while the test signal on output pin 215 is generated. For example, the virtual signal generator may hold output pins, connected to pins of the second device not being tested, at ground. Though for some circuit assemblies it may be possible to test pins connected on different nets on the circuit assembly simultaneously. In that scenario, it may be possible to also generate learned signals for those pins simultaneously.

The test signal may be an impulsive on other rapidly changing signal that will generate a discernable transient response. In some embodiments, the test signal includes an "edge" at which a rapid change in voltage occurs. In some embodiments, the test signal is a "pulse" having two edges. The pulse is marked by a rapid change in voltage, followed by another rapid change in voltage, typically a return to the original voltage level. Any suitable dwell time between the leading and trailing edges of the pulse may be used.

The output test signal propagates along signal path 220 to the corresponding pin 233 of the second device 230. The test signal is then capacitively coupled to the detector plate 231. The signal coupled to the detector plate is the response signal.

At step 507, the response signal is conditioned. In some embodiments, conditioning includes buffering, filtering, and/or amplifying the response signal. The signal may be conditioned using techniques as are known in the art or in any other suitable way. For example, the detector plate 231 may be buffered by buffer 246. The coupled signal may be filtered by a filter 244. Filter 244 may be a low pass or band pass filter adapted to pass signals shaped as the expected response signal. The coupled signal also may be amplified by amplifier 243, though any suitable amplifier may be used.

At step 509, the response signal is digitized. For example, the response signal may be digitized by ADC 247. Any suitable sample rate and quantization may be used.

The sampled signal may be used as a learned signal, depending on subsequent process.

At step 511, the response signal is applied to an autocorrelation function to determine a threshold value to use when comparing a response signal during a test to the learned signal. In some embodiments, the autocorrelation function may be to a de-normalized autocorrelation function, R(d), for zero time shift, i.e., d=0. Representing the successive samples of the response signal by the vector $\bar{x}$ with the entries, $x_i$, the de-normalized autocorrelation of $\bar{x}$ for d=0 is $$R(0) = \sum_i (x_i - \mu_x)^2, \qquad (1)$$

where $\mu_x$ is the average value of the entries of $\bar{x}$.

Optionally at step 513, steps 505 through 511 are repeated for a total of n times, including the initial iteration. By repeating the test, an average of the autocorrelation may be used as a threshold and/or averaged values of the response signal may by used as the learned signal. Additionally, repetition may indicate whether the test configuration for the pin produces a repeatable result such that it would constitute a useful test configuration on a circuit assembly under test. The number of times the test is performed may be determined in any suitable way. For example, a predetermined value may be selected or may be determined dynamically based on agreement between successive iterations.

At step 515, the standard deviation, σ, of the autocorrelation results, R(0), for the n iterations is determined.

At step 517, it is determined if the standard deviation is acceptable. For example, the standard deviation may be compared to a predetermined value which may be determined in any suitable way. If the standard deviation is less than the predetermined value, it is acceptable.

If the standard deviation is determined to be unacceptable, step 519 is performed. If processing reaches step 519, no learned signal is stored for the selected pin. If no learned signal is stored, the selected pin may not be testable using the described test method. Though, the pin may not be testable with the device selected at step 505 to be the virtual signal generator, but may be testable with another device used as a virtual signal generator. Accordingly, though FIG. 5 shows the method 500 ending after step 519, further processing may be performed to identify another virtual signal generator or another testing approach for the pin.

Conversely, if the standard deviation is determined to be acceptable, step 521 is performed. At step 521, the reference value and/or thresholds are determined. In some embodiments, the average autocorrelation is computed to be the reference value. Note that the average autocorrelation may have been calculated as an intermediate step in determining the standard deviation at step 515 and it is not critical that the steps be performed in the order illustrated. High and low thresholds may be determined as a percentage of the reference auto-correlation value. For example, in some embodiments the high threshold is set to 125% of the reference auto-correlation value and the low threshold is set to 75% of the reference auto-correlation value. In some embodiments the reference signals of the n tests may be suitably cross-correlated to determine a reference value and/or thresholds.

A threshold condition may be defined for each threshold. The threshold condition specifies whether a test value compared to the threshold passes when it exceeds the threshold or is less than the threshold. For example, when a single threshold is defined the threshold conditions may specify that a test value must exceed the threshold in order to pass. As another example, when a high and low threshold are used to define a threshold window the threshold conditions may specify that the test signal must exceed the low threshold and be less than the high threshold in order to pass.

At step 523, the learned signal and reference value are then recorded, for example, on the storage media 251 (FIG. 2) as part of a test plan for the circuit assembly. The learned signal may be determined in any suitable way. For example, the learned signal may be selected as the response signal whose autocorrelation most closely matches the average autocorrelation (i.e., the reference value). In other embodiments, the n response signals may be suitably averaged to establish the learned signal. For example, the digital vectors for the n response signals may be averaged at each point location in the vectors to established the learned signal. Averaging may help eliminate variations due to random noise. The noise typically decreases by $n^{-1/2}$. The one or more thresholds and associated threshold conditions may also be recorded at step 523. The method 500 ends at step 525.

The method 500 may be repeated for another test pin or may be performed simultaneously for multiple test pins. Test signals, and particularly the "edges" thereof, provided to pins adjacent a common detector plate may be spaced in time so that any transient features in the response signal may be associated, based on time, with a test signal applied to a single pin under test. In some embodiments, the boundary scan operation initiated in step 505 may generate a test signal that propagates along a boundary scan chain in the BSD virtual signal generator 210 to be applied to successive outputs of the virtual signal generator in successive intervals of a test clock applied the virtual signal generator. However, test signals for different pins may be generated in any suitable order. In fact, method 500 poses no limitation on the number of scan cells in the boundary scan chain within the virtual signal generator. Significant flexibility is possible in selecting which outputs of the virtual signal generator are used to generate test signals and the order and frequency with which test signals appear on those outputs.

In some embodiments, when a test signal contains multiple edges, those edges are spaced in time so that during the time between edges, test signals may be applied to other pins under test. For example, a leading edge portion of each test signal may be applied to each pin under test before the trailing edge portion is applied to any. In this way the leading and trailing edges of a test pulse may be substantially spaced apart in time from each other with other pins being tested during the time between the edges. When other pins are tested during this time, the portions of the response signal corresponding to the leading and trailing edges for a single pin under test may be analyzed independently.

In some embodiments, a learned signal and a low and high threshold are determined for each impulsive feature of the test signal. For example, if the test signal is a pulse, a learned signal and thresholds may be determined for the leading edge, and another learned signal and thresholds determined for the trailing edge. Treating a leading and trailing edge of pulse as two separate test signals, each with a different learned response, may be useful, for example, if test signals are applied to other test pins between the leading and falling edges.

In yet some other embodiments, the response to all features of the test signal are characterized by a single learned signal and thresholds. Again, using the example of a pulse, a learned signal and thresholds may be used to characterize the entire response, including the response to both the leading and trailing edges.

When method 500 is being performed for multiple pins, the test system 240 and computer 250 may be configured to track the pin under test to which the response signal corresponds at a given time. In this way, learned signals and thresholds may be properly determined.

Regardless of the number and type of test signals determined for each pin to be tested, once all learned signals are available, they may be used for testing boards during manufacture. As part of the manufacturing process, a production test phase is performed for circuit assemblies with unknown characteristics. The test phase may be performed after soldering of components to a printed circuit board and may be performed to determine whether solder joints are good or faulty. This information may then be used to appropriately route the circuit assembly in subsequent stages of the manufacturing operation. A faulty circuit assembly, for example, may be routed for rework. A good circuit assembly, on the other hand, may be routed to other stages in the manufacturing operation, such as where the circuit assembly may be packaged for shipment.

The production test phase may be performed according to method 600, shown as a flow diagram in FIG. 6. In some embodiments, computer-executable instructions are recorded on storage media 251 of computer 250 and executed by processing unit 255 to control test system 240 and perform method 500.

The flow diagram of method 600 begins at step 601. The method may performed once for each pin under test, though multiple pins may be tested in parallel or in any suitable order.

At step 603, the virtual signal generator 210 is configured to generate a test signal for the pin under test. In some embodiments, the virtual signal generator 210 may be a BSD configured by connecting the control connection 211 to a TAP of the BSD. The appropriate ATE digital drivers 241 may program the virtual signal generator 210 or otherwise control the virtual signal generator 210 to output test signals at the appropriate times. Preferably the test signal to be generated has the same shape and amplitude as the test signal used for the test pin during the learn phase.

At step 605, the detector plate 231 is placed adjacent to the second device 230. This step may include placing on assembly under test in a fixture or other suitable mechanical structure.

At step 607, boundary scan operation is enabled and a test signal is applied to the appropriate output pin 215 of a BSD virtual signal generator 210 at the appropriate time. If virtual signal generator 210 is not a boundary scan device, step 607 may be performed by initiating a program, executing commands, or otherwise causing the virtual signal generator 210 to output a test signal to one or more of its output pins 215.

At step 609, the response signal capacitively coupled to the detector plate is conditioned. Conditioning may include, for example, buffering, filtering, and amplifying as described above with reference to the test setup 200 (FIG. 3) and step 507 of method 500 (FIG. 5).

At step 611, the response signal is digitized. For example, the response signal may be digitized by ADC 247. Any suitable sample rate and quantization may be used to digitize the signal.

At step 613, time domain analysis is performed on the response signal. In embodiments in which a test signal contains multiple impulsive features, the response signal may be partitioned into time windows corresponding to each impulsive feature and the response to each such feature may be analyzed separately. Though, if a test signal contain multiple impulsive features, the time window may be selected to encompass a transient response to all of the impulsive features.

In some embodiments, time domain analysis is performed by comparing the response to be learned signal. The comparison may be made by calculating a correlation of the response and the learned signals. In some embodiments, the correlation may be a de-normalized cross-correlation of the response signal and the learned signal. For each pin tested the sampled response signal in the relevant time window may be represented by the vector $\bar{y}$ with entries, $y_i$. The de-normalized cross-correlation of the response signal, $\bar{y}$, and the learned signal, $\bar{x}$, may be calculated according to Eq. 2.

$$R(d) = \sum_i (x_i - \mu_x)(y_{(i-d)} - \mu_y) \quad (2)$$

In Eq. 2, $\mu_y$ is the average value of the entries of $\bar{y}$. In Eq. 2 it is assumed that the learned signal and reference signal are digitized at the same sample rate. If the signals are sampled at different rates, interpolation may be used. If multiple tests are performed for the same test pin, R(d) may be calculated for each. The index i, may be restricted to a range such that i and i–d index entries in $\bar{x}$ and $\bar{y}$, respectively. In some other embodiments the vectors are zero padded. In yet some other embodiments, the vector $\bar{y}$ is sufficiently long relative to $\bar{x}$ so that R(d) for all reasonable value of d may be calculated.

In some embodiments, a normalized cross-correlation is also calculated. The normalized cross-correlation may be used when an interference signal is synchronous with the test signal. For example, for some boundary scan devices, in order to generate a test signal from a boundary scan device, the test access port is clocked with a clock, called TCK (FIG. 3). The clock, TCK, may couple to the second device, via one or more signal paths. The test signal being applied to the pin under test may mix constructively or destructively with the TCK signal, which may alter the response signal.

Figure 7:
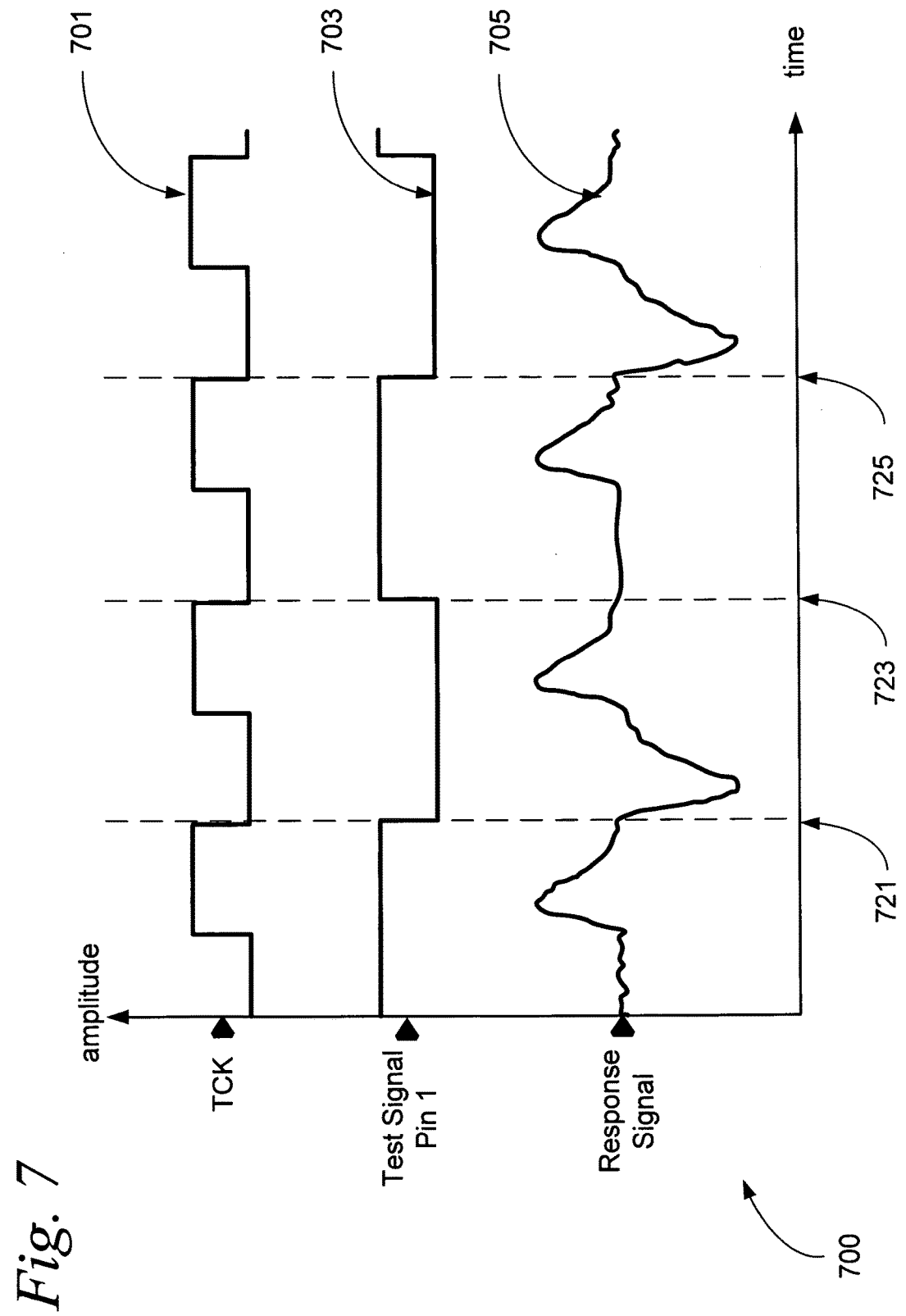
FIG. 7 is a plot of experimental test signals.

Plot 700, shown in FIG. 7 illustrates such an example. Plot 700 and plot 400 (FIG. 4) are formatted similarly. The TCK clock signal 701 interferes constructively at times 721 and 725 with the test signal 703 and interferes destructively at time 723. The response signal 705 is very small at time 723.

The de-normalized cross-correlation may be used to detect an open pin at the reinforcing edge (times 721 and 725) without ambiguity because an open pin will display a signal about half the size of the learned signal. However, the cancellation edge (time 723) will produce a learned de-normalized cross-correlation that is nearly zero yielding a small value for both good pins and faulty pins.

The ambiguity may be eliminated by considering both the de-normalized cross-correlation (Eq. 2) and the normalized cross-correlation, $$R_n(d) = \frac{\sum_i (x_i - \mu_x)(y_{(i-d)} - \mu_y)}{\sqrt{\sum_i (x_i - \mu_x)^2} \sqrt{\sum_i (y_i - \mu_y)^2}}. \quad (3)$$

In Eq. 3 it is assumed that the learned signal and reference signal are digitized at the same sample rate. If the signals are sampled at different rates, interpolation may be used. While on the cancellation edge, the de-normalized cross-correlation is close to zero for both good and faulty pins, the normalized cross-correlation is large only for a good pin. Thus, using the normalized cross-correlation, either alone or in combination with the de-normalized cross-correlation, allows faulty pins to be distinguished from good pins even if interference occurs.

In yet some other embodiments, the difference between the positive and negative peak values of the response signal are considered as part of the analysis of a response signal. For example, data points near the peak negative value of the response signal may be averaged, and subtracted from the average of data points near the peak positive value. This computed value reduces the effect of any DC offset that may be present in the response signal.

Regardless of the specific processing performed at step 613, the process proceeds to step 615 where the result of the time domain analysis in step 613 is compared to one or more thresholds. If time domain analysis is performed using the de-normalized cross-correlation, the value of R(d) may be compared to these thresholds. For example, in some embodiments it is determined if R(d) is within a threshold window defined by a low threshold and a high threshold. In some other embodiments R(d) is compared to a single threshold. If a given threshold was not determined in step 521 of method 500, the thresholds may be based on the reference value recorded in step 523. In some embodiments, the thresholds may be a percentage of the reference value, for example, 75% and 125% for the low and high thresholds, respectively.

If time domain analysis is performed using the normalized cross-correlation, the maximum value of the normalized cross-correlation may be compared to a predetermined threshold, for example, 0.75.

If the peak to peak distance is calculated in step 613, it is compared against a threshold to determine the quality of the electrical connection to a pin under test. For example, a percentage of the peak to peak distance of the learned signal may be used.

In some embodiments, the test signal has multiple impulsive features. For example, a pulse has a leading edge and a trailing edge which serve as features. The entire response to the test signal may be characterized by a single response signal which is analyzed and compared to a one or more thresholds at step 613.

In some other embodiments, the features may each have been characterized independently in the learn phase by a learned signal and one or more thresholds corresponding to that feature. The result of each time domain analysis may be compared to the corresponding threshold or threshold window. The results may be combined to produce a decision for step 615 in any suitable way.

Regardless of how the multiple features are combined, the result is a quantitative indication of the likelihood that the learned signal is included in the response. If the magnitude of that indication meets all of the threshold conditions, at step 617 it is determined that the pin under test passes. For example, if the indication is within a threshold window it is determined that the pin under test passes. An indication that the pin passed may be stored or provided on output device 260. The method 600 then ends at step 619.

If the magnitude of the indication does not meet all of the threshold conditions, at step 621 it is determined the pin fails, and a fault is indicated. For example, if the magnitude of the indication does not fall within a threshold window as defined by a low and high threshold. At step 623 additional steps to determine the nature of the fault may optionally be performed. These steps are subsequently described with reference to method 900. The method 600 then ends at step 625. Regardless of how the test ends, method 600 may be repeated to test other pins on the circuit assembly.

Figure 8A:
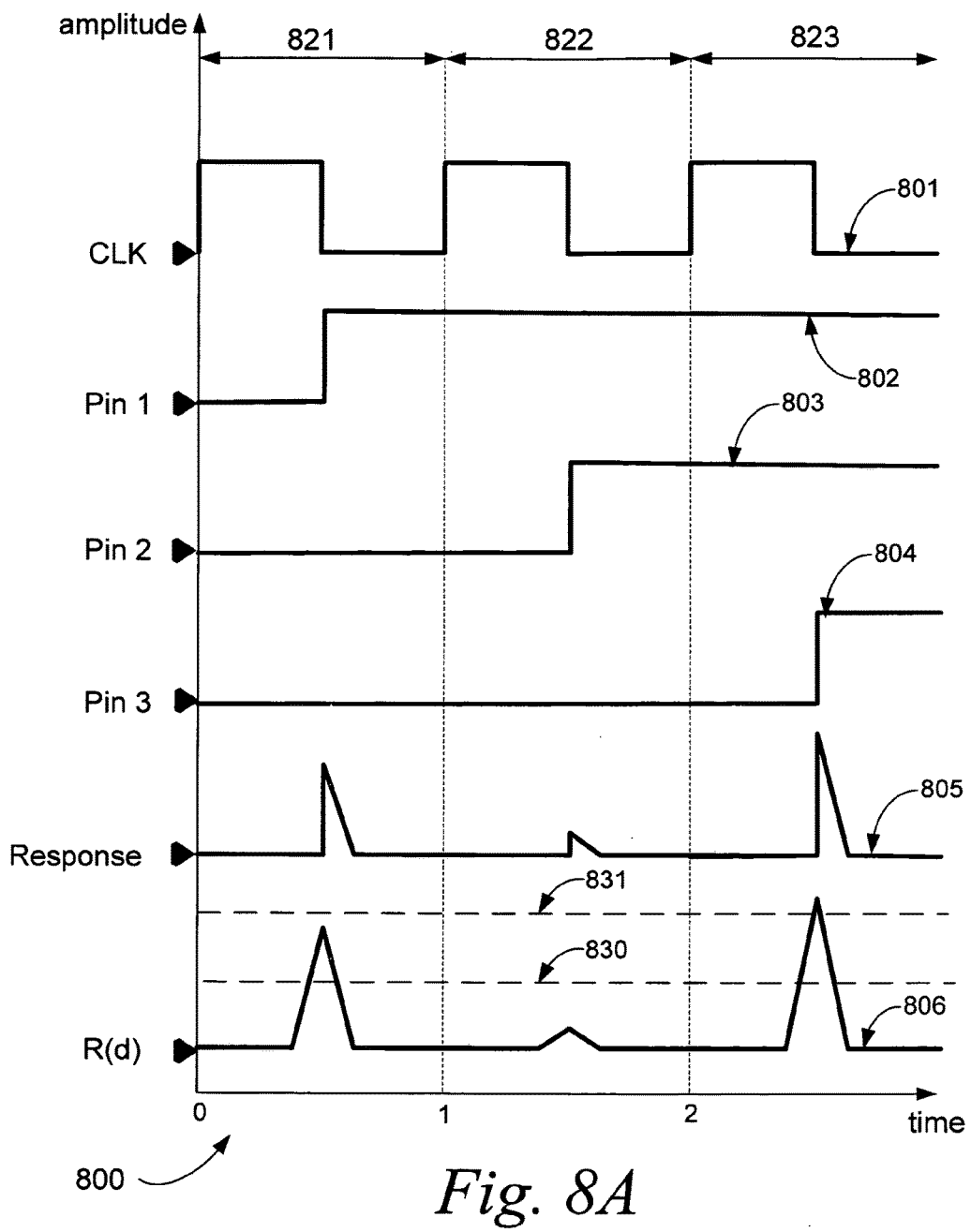
FIG. 8A is a conceptual plot of input and output signals during testing according to some embodiments.

FIGS. 8A-8H illustrates conceptually input signals and response signals according to some embodiments of method 600. FIG. 8A illustrates a plot 800, which is formatted similarly as plot 400 (FIG. 4). Time is shown in units of clock cycles. In this example, clock signal 801 is provided for reference and is not connected to the second device 230 but may be, for example, a test clock. Test signals 802, 803, and 804 are output from a suitable virtual signal generator 210 onto signal paths 220 whose connection to test pins 1, 2, and 3, respectively, on a second device 230, are being tested. Here each of the test signals has a single edge. The test signals are each sufficiently spaced such that the response signals to each edge do not overlap and may be analyzed unambiguously. Signal 805 is the response signal 805.

Figure 8B:
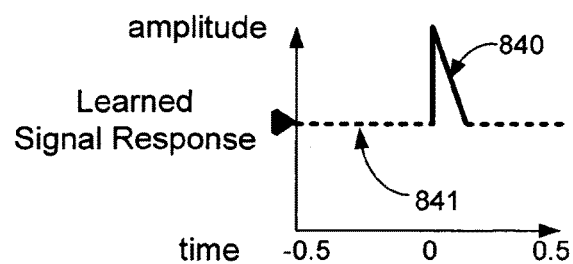
FIGS. 8B-8E are conceptual plots of output signals during testing according to some embodiments.

Cross-correlation 806 is the cross-correlation of the response signal 805 with the learned signal 840 (FIG. 8B). In some embodiments the learned signal 840 may be cropped to only include the response signals feature. For example, dashed portions 841, having a relatively low value, may be omitted from the cross correlation or other analysis. Note that the de-normalized cross-correlation R(d) is generally of a different unit than the other signals. For example, if the learned and response signals are in volts, the de-normalized cross-correlation is in volts-squared. The threshold 830 is the value used in step 615 of method 600 to determine if a test pin passes or fails the test. For simplicity, FIG. 8A illustrates that all pins are tested with the same thresholds. However, each pin may have a different set of one or more thresholds.

Each test pin represented in plot 800 is associated with a time window in which the response signal is associated with that pin. The respective time windows for pins 1, 2 and 3 are time windows 821, 822, and 823. These windows are determined based on the time the virtual signal generator is controlled to output a test signal on a signal path that should be coupled to that pin. In this example, each pin passes or fails based on whether the cross-correlation peaks within the threshold window during its time window. The threshold window is defined by the low threshold 830 and a high threshold 831. During the time windows 821 and 823, corresponding to pins 1 and 3, respectively, the cross-correlation peaks above the low threshold 830. The cross correlation peaks in time window 821 below the high threshold 831. However, the cross correlation peaks above the high threshold 831 in window 823. In window 822 the cross correlation 806 never exceeds the low threshold 830. Accordingly, pin 1 passes because the cross correlation 806 peaks within the threshold window defined by the low threshold 830 and the high threshold 831. Pin 2 fails because it never exceeds the low threshold 830. Similarly, pin 3 fails because it exceeds the high threshold 831. Neither pin 2 or pin 3 peak within their respective windows.

Figure 8C:
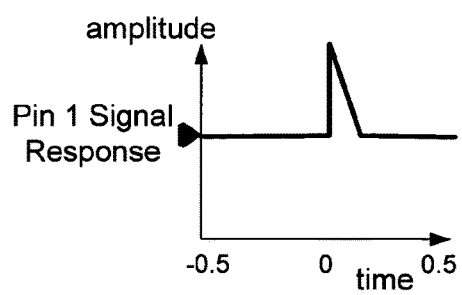
Figure 8F:
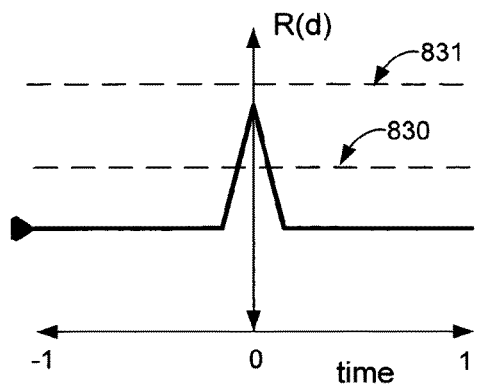
FIGS. 8F-8H are conceptual plots of the cross-correlation for a conceptual output signal and learned signal during testing according to some embodiments.
Figure 8D:
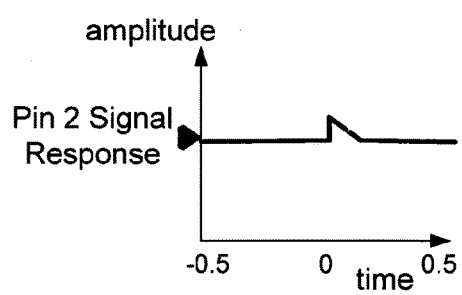
Figure 8G:
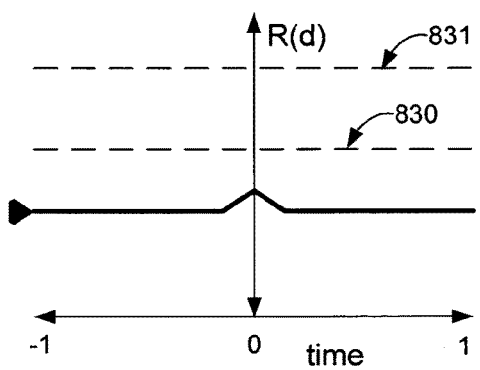
Figure 8E:
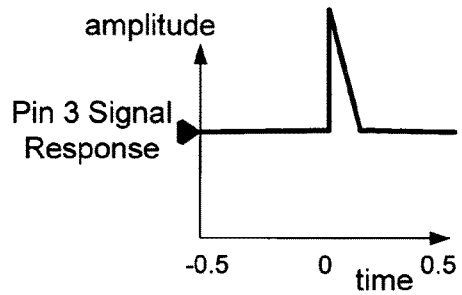
Figure 8H:
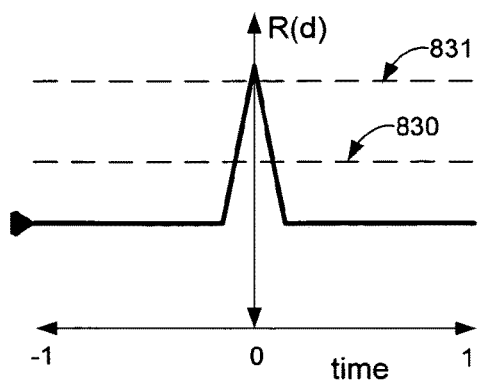

In another embodiment, the response signal is partitioned into a vector $\bar{y}$ for each test pin prior to cross-correlating. The partitions may correspond to the same time windows as above. The windowed signals for pins 1, 2, and 3, are shown in FIGS. 8C-8E, respectively. The response signal data in each window is cross-correlated with a learned signal such as signal 840 (FIG. 8B). Though, a different learned signal may be used for analyzing each pin. The cross-correlations, R(d) are shown in FIGS. 8F-8H for pins 1, 2, and 3, respectively. The low threshold 830 and high threshold 831 indicate that pins 1 passes (FIG. 8F). Pin 2 (FIG. 8G) and pin 3 (FIG. 8H) fail because they fail to meet the low threshold condition and the high threshold condition, respectively.

If the performance of method 600 results in a determination that the test pin is faulty at step 621, additional testing may be performed to determine the nature of the fault (step 623). FIG. 9 illustrates a method 900 that may be performed to complete step 623. In some embodiments, method 900 is postponed until all pins to be tested according to method 600 have been tested. In some cases the performing method 900 may be obviated by doing so. For example, if a test pin fails and all pins it may be shorted to pass, it may be determined the test pin is open without performing method 900. Method 900 may be used, for example, to determine the nature of the fault on output and bi-directional IC pins. Method 900 may not readily identify shorts to IC input pins.

Method 900 begins at step 901. At step 903, the virtual signal generator is configured to apply the appropriate test signals. The virtual signal generator may be configured to output test signals to the failed pin and one or more second pins. The second pins may include, for example, any pins on the same component as the failed pin or other pins to which the test pin may be shorted.

At step 905, the test signals are output by the virtual signal generator.

At step 907, the response signal coupled to the detector plate is measured, appropriately conditioned, and digitized. Conditioning may include buffering, filtering, and/or amplifying. Conditioning may be performed as in step 507 of method 500 and/or step 609 of method 600.

At step 909, a signal magnitude of the response signal is determined using time domain analysis.

At step 911, the signal magnitude is compared to a suitable threshold.

If the signal magnitude increases by more than the threshold amount above the value measured with a test signal applied to just the failed pin, it is determined at step 913 that the test pin is shorted to at least one of the second pins being driven along with the failed pin. Method 900 is optionally repeated using a series of subsets of the group of second pins to determine which of the second pins the test pin is shorted to (dashed path 914). It the group of second pins contains only one pin, it is determined that the second pin is shorted to that second pin.

At step 915, an output is provided indicating the test pin is shorted. For example, the output may be provided on output device 260 (FIG. 2). Optionally, the second pin or pins it is shorted to is also provided. The method then ends at step 917.

If at step 911, it is determined that the signal magnitude increases by less than the threshold when the failed pin is driven along with at least one second pin, the process branches to step 919. At step 919 it is determined if there are more second pins to test.

If it is determined at step 919 that there are more pins to test, the method continues to step 921 where the test is repeated with a different second pins.

If it is determined at step 919 that there are not more pins to test, it is indicated at step 923 that the failed pin is an open pin. The method then ends at step 925. However, if step 919 is performed as part of optionally repeating the method for step 919, dashed path 920 is followed to step 915.

Figure 10A:
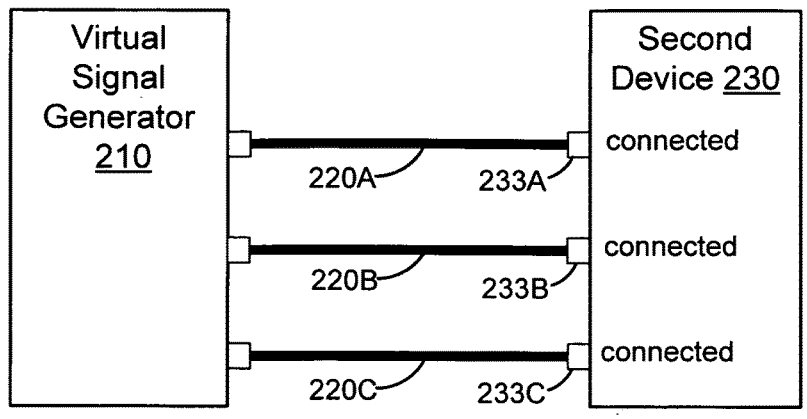
FIGS. 10A-10C are block diagrams illustrating example test scenarios for identifying a type of defect.
Figure 10B:
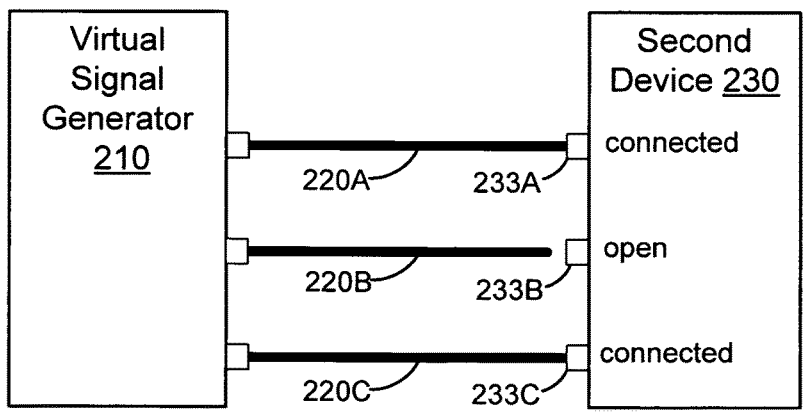
Figure 10C:
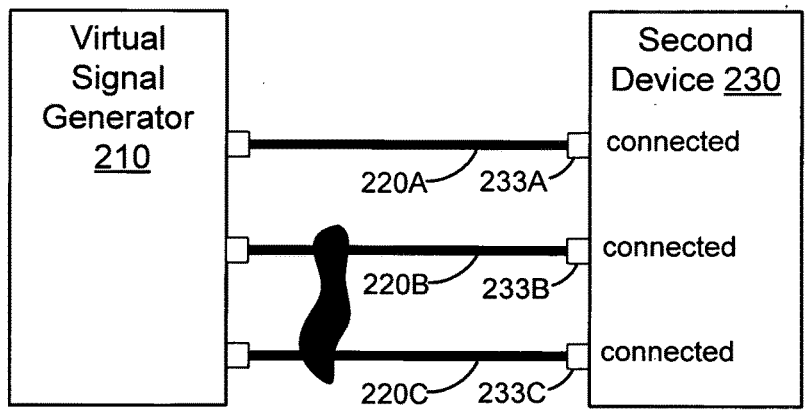

FIGS. 10A-10C provide example cases for demonstrating some embodiments of method 600 and method 900. In each example, a virtual signal generator 210 is connected to a second device 230 by signal paths 220A, 220B, and 220C. The signal paths connect to pins 233A, 233B, and 233C of the second device 230. The electrical connection between the pin and the corresponding signal path is indicated. These examples illustrate how it may be determined that pin 233B has a good electrical connection, an open, or a short according to methods 600 and 900. In the case of a short, it is further determined which pin 233B is shorted to. It is assumed that test signals input on all three pins are coupled to a common detector plate (not shown).

In FIG. 10A pin 233B has a good electrical connection to signal path 220B and is not shorted. When method 600 is performed for pin 233B the signals output by the virtual signal generator may correspond to test number 1 shown in Table 1 which summarizes the input signals and output result. In these examples, a "pulse" is used for the test signal and ground is used as a fixed voltage, however any suitable signals may be used. If an appropriate pass criterion has been established and the method is conducted successfully pin 233B passes. In this example, the response signal is analyzed by cross-correlating it with a learned signal and comparing the result to a threshold window defined by a low and high threshold. The thresholds may be determined from the learned signal.

TABLE 1

| Test # | Input | | | Output | |
|---|---|---|---|---|---|
| | Pin 233A | Pin 233B | Pin 233C | Response | Conclusion |
| 1 | ground | pulse | ground | Low < R(d) < High threshold | Pass |

With reference to Table 2 and FIG. 10B, the test pin 233B is open and is not shorted to the other pins. When method 600 is performed as above with reference to FIG. 10A, the signal analysis will indicate a test failure (test number 1). Prior to performing method 900, method 600 may be performed for all the pins test pin 233B may be shorted to, in this case pins 233A and 233C. This alone may be sufficient to determine pin 233B is open. If other pins have failed, however, some ambiguity may remain and method 900 may be performed to determine the cause of the failure. However, method 900 may additionally be performed to further verify this conclusion. Pins 233A and 233C are identified as potential second pins. For test number 2, pin 233A is identified as the second pin and test signals are applied to pins 233A and 233B, while pin 233C is held at ground. Time domain analysis may be performed, for example, by simply looking for a large response signal as compared to the learned response for pin 233A. In this case the response signal will not be sufficiently large and it is determined that pins 233A and 233B are not shorted. Test number 3 is performed similarly, with the same result. Having exhausted all the possible pins test pin 233B could be shorted with, it is determined test pin 233B is open.

TABLE 2

| Test # | Input | | | Response | |
|---|---|---|---|---|---|
| | Pin 233A | Pin 233B | Pin 233C | Response | Conclusion |
| 1 | ground | pulse | ground | R(d) < Low threshold | Fail |
| 2 | pulse | pulse | ground | <Low threshold | Not Shorted to pin 233A |
| 3 | ground | pulse | pulse | <Low threshold | Open |

With reference to Table 3 and FIG. 10C, the test pin 233B is connected to signal path 220B but is also shorted to pin 233C. When method 600 is performed for pin 233B, the cross correlation will fall below the low threshold. Note that this is the same result as for an open pin (see test number 1 in Table 2). If method 600 is performed for pins 233A and 233C it will determine pin 233A passes and pin 233C fails. However, ambiguity remains as to whether pins 233B and 233C are shorted or both open. In test number 2, test signals are applied to pins 233B and 233C simultaneously. A response signal comparable in magnitude to either pin learned response signal indicates that at least one pin is connected and that they are shorted. A substantially large response signal may be evidence that both pins are connected to their respective signal paths. For example, the response signal may be comparable to the sum of the learned signals for both pins.

TABLE 3

| Test # | Input | | | Response | |
|---|---|---|---|---|---|
| | Pin 233A | Pin 233B | Pin 233C | Response | Conclusion |
| 1 | ground | pulse | ground | R(d) < Low threshold | Fail |
| 2 | ground | pulse | pulse | >High threshold | Shorted to pin 233C |

Generally the steps of methods 500, 600, and 900 may be performed in any suitable order. In as much as a step is independent of another step, it may be performed before, after or during the performance of the step.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. A method of testing a circuit assembly, the method comprising:
    configuring a first component on the circuit assembly to generate a first signal on a first pin of the first component, the first signal comprising at least one leading edge and at least one trailing edge;
    placing a probe adjacent a second component on the circuit assembly;

obtaining a learned signal representative of an expected transient response to the at least one leading edge and at least one trailing edge;

performing time domain analysis of a second signal, the second signal being capacitively coupled from the second component to the probe, and the time domain analysis comprising performing a cross-correlation of at least one portion of the second signal to the learned signal, the at least one portion of the second signal comprising a plurality of edges corresponding to the at least one leading edge and the at least one trailing edge; and indicating a test result based on the time domain analysis of the second signal, wherein the test result is a value indicative of a degree of similarity between the at least one portion of the second signal and the learned signal.

2. The method of claim 1, wherein the first component is a boundary scan device.

3. The method of claim 2, wherein the configuring comprises controlling the boundary scan device through a test access port to generate the first signal.

4. The method of claim 1, further comprising digitizing the second signal prior to performing time domain analysis on the second signal.

5. The method of claim 1, wherein the performing time domain analysis comprises cross-correlating the second signal with a reference vector representative of the expected transient response.

6. The method of claim 5, wherein:
the reference vector is determined experimentally from the obtained learned signal; and
the obtained learned signal is obtained by measuring the amount of a reference signal coupled to a capacitive probe from a known good circuit assembly.

7. The method of claim 5, wherein, when a magnitude of the cross-correlation is outside a threshold window defined by a low threshold and a high threshold, the indicating the test result comprises indicating a fault.

8. The method of claim 7, wherein, when a fault is detected,
the magnitude of the cross-correlation is a first magnitude;
the method further comprises reconfiguring the first component to generate the first signal on the first pin and at least one second pin of the first component and again performing time domain analysis of the second signal to compute a second magnitude; and
indicating the fault is a short when the second magnitude exceeds the first magnitude by a threshold amount.

9. The method of claim 8, wherein the method further comprises:
repeating the act of reconfiguring the first component to generate the first signal on the first pin and at least one second pin of the first component and again performing time domain analysis of the second signal to compute a second magnitude, within each repetition a different pin of the first component used as the at least one second pin; and
when the acts of reconfiguring and performing time domain analysis are repeated for each pin in a predetermined group without identifying a repetition in which the second magnitude exceeds the first magnitude by the threshold amount, indicating that the fault is an open.

10. The method of claim 7, further comprising computing the high and low thresholds as a percentage of an autocorrelation of the reference vector.

11. The method of claim 1, wherein the at least one leading edge and the at least one trailing edge comprise a pulse.

12. The method of claim 11, wherein the performing time domain analysis comprises:
digitizing the second signal;
computing a first average of a first set of points representing a positive extreme portion of the second signal;
computing a second average of a second set of points representing a negative extreme portion of the second signal; and
comparing the difference between the first average and the second average to at least one threshold.

13. The method of claim 1, wherein the test result indicates a quality of a signal path between the first component and the second component.

14. The method of claim 13, wherein the signal path is at least a portion of a bus configured to operate at 3 Gbps or greater.

15. The method of claim 14, wherein the bus is any one of a PCI Express bus, a serial ATA (SATA) bus, or a Quick Interconnect (QPI).

16. The method of claim 1, wherein a signal trace connecting the first pin to the second component is substantially free of test access pads.

17. The method of claim 1, further comprising:
coupling a test system to the first component; and
wherein:
the configuring comprises controlling the first component from the test system; and
performing time domain analysis comprises capturing the second signal with a data capture circuit.

18. The method of claim 1, wherein the performing time domain analysis comprises determining a normalized cross-correlation of the second signal with a reference vector and determining a de-normalized cross-correlation of the second signal with the reference vector.

19. A method of manufacturing a circuit assembly, the method comprising:
testing the circuit assembly in accordance with the method of claim 1, the circuit assembly being tested after a first portion of a manufacturing process has been performed; and
selecting steps in a second portion of the manufacturing process based on the indicated test result.

20. A method of testing a circuit assembly, the method comprising:
generating a plurality of first signals, each first signal generated on a corresponding first pin from a plurality of first pins, the generating comprising shifting a boundary scan chain in at least a first component, such that each of the plurality of first signals comprises at least one leading edge and at least one trailing edge;
placing a probe adjacent a second component on the circuit assembly, the second component comprising a plurality of second pins;
analyzing a second signal capacitively coupled from the second component to the probe, the analyzing comprising, for each of a plurality of time windows in the second signal, cross-correlating the second signal in the window with a reference vector representative of a learned signal representative of an expected transient response to a signal of the plurality of first signals coupled to the probe through a different pin of the second component, wherein the plurality of time windows are determined based on times of shifting the boundary scan chain, such that each of the plurality of windows corresponds to the at least one leading edge and the at least one trailing edge of a respective first signal of the plurality of first signals; and indicating a test result based on the analyzing, wherein the test result is a value indicative of a degree of similarity between the second signal and the learned signal.

21. The method of claim 20, wherein the first component is a boundary scan based device.

22. The method of claim 21, wherein the generating comprises controlling the boundary scan device through a test access port.

23. The method of claim 22, wherein the plurality of first signals comprises time shifted versions of a reference first signal comprising at least one pulse and a representation of the reference first signal is sequentially shifted through a boundary scan chain.

24. The method of claim 20, wherein each first signal among the plurality of first signals comprises an impulsive feature and each first signal's feature occurs at a different time than every other first signal's feature.

* * * * *